United States Patent
Loughmiller

(10) Patent No.: US 7,254,753 B2
(45) Date of Patent: Aug. 7, 2007

(54) CIRCUIT AND METHOD FOR CONFIGURING CAM ARRAY MARGIN TEST AND OPERATION

(75) Inventor: Daniel R. Loughmiller, Boise, ID (US)

(73) Assignee: Micron Technology, Inc., Boise, ID (US)

(*) Notice: Subject to any disclaimer, the term of this patent is extended or adjusted under 35 U.S.C. 154(b) by 543 days.

(21) Appl. No.: 10/626,728

(22) Filed: Jul. 25, 2003

(65) Prior Publication Data

US 2005/0022079 A1    Jan. 27, 2005

(51) Int. Cl.
  *G06F 11/00*    (2006.01)
(52) U.S. Cl. .................. 714/703; 714/733
(58) Field of Classification Search ........... 219/666; 714/718, 724, 700, 703, 733; 365/49
See application file for complete search history.

(56) References Cited

U.S. PATENT DOCUMENTS

| | | | |
|---|---|---|---|
| 4,114,010 A * | 9/1978 | Lewis | 219/666 |
| 4,680,760 A * | 7/1987 | Giles et al. | 714/718 |
| 6,125,049 A | 9/2000 | Nataraj | |
| 6,320,777 B1 | 11/2001 | Lines et al. | |
| 6,523,145 B1 | 2/2003 | Ngo et al. | |
| 6,618,279 B2 * | 9/2003 | Towler et al. | 365/49 |
| 6,697,275 B1 * | 2/2004 | Sywyk et al. | 365/49 |
| 6,697,277 B2 * | 2/2004 | Towler et al. | 365/49 |
| 6,867,990 B2 * | 3/2005 | Regev et al. | 365/49 |
| 6,990,001 B2 * | 1/2006 | Ma et al. | 365/49 |
| 2003/0026148 A1 | 2/2003 | Clark et al. | |

* cited by examiner

*Primary Examiner*—David Ton
(74) *Attorney, Agent, or Firm*—Dickstein Shapiro LLP

(57) ABSTRACT

A test circuit for a content addressable memory (CAM) match detection circuit that permits testing of the margin of the match detection circuit. By applying various loads to the matchline and/or the discharge line, the match detection circuit demonstrates whether it can overcome the applied loads.

64 Claims, 8 Drawing Sheets

CIRCUIT AND METHOD FOR CONFIGURING CAM ARRAY MARGIN TEST AND OPERATION

FIELD OF THE INVENTION

The present invention relates generally to semiconductor memory, and more particularly to a circuit and method for configuring cam array margin test and operation.

BACKGROUND OF THE INVENTION

A content addressable memory (CAM) is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., random access memory (RAM), dynamic RAM (DRAM), etc.). For example, data is stored in a RAM in a particular location, called an address. During a memory access, the user supplies an address and reads into or gets back the data at the specified address.

In a CAM, however, data is stored in locations in a somewhat random fashion. The locations can be selected by an address bus, or the data can be written into the first empty memory location. Every location has a pair of status bits that keep track of whether the location is storing valid information in it or is empty and available for writing.

Once information is stored in a memory location, it is found by comparing every bit in memory with data in the comparand register. When the content stored in the CAM memory location does not match the data in the comparand register, the local match detection circuit returns a no match indication. When the content stored in the CAM memory location matches the data in the comparand register, a local match detection circuit returns a match indication. If one or more local match detection circuits return a match indication, the CAM device returns a "match" indication. Otherwise, the CAM device returns a "no-match" indication. In addition, the CAM may return the identification of the address location in which the matched data is stored or one of such addresses if more than one address contained matching data. Thus, with a CAM, the user supplies the data and gets back the address if there is a match found in memory.

Locally, CAMs may perform match detection using an exclusive-NOR (XNOR) function, so that a match is indicated only if both the stored bit and the corresponding input bit are the same state. CAMs are designed so that any number of stored bits may be simultaneously detected for a match with the input bits in the match detection circuit. One way in which this is achieved is by coupling a plurality of storage devices and logic circuits to a common matchline, as depicted in FIG. 1.

Turning to FIG. 1, a schematic diagram of a conventional match detection circuit 100 is depicted. A first source/drain terminal of a precharge transistor 102 is coupled to a positive voltage source (e.g., VDD). The gate of transistor 102 is coupled to a signal line 138 for receiving a precharge signal. A second source/drain terminal of transistor 102 is coupled to a matchline 140 for precharging the matchline 140 to a predetermined voltage level (e.g., VDD).

The match detection circuit 100 includes several CAM cells 191, which are used to store data. CAM cells 191 also compare the stored data to comparand data to determine if the stored data and the comparand data are substantially the same. Each CAM cell 191 is coupled to matchline 140 through lines 120, 122. Each CAM cell 191 is coupled to discharge line 142 through lines 128, 130. The discharge line 142 is electrically coupled to a ground potential through line 190.

Also coupled to the matchline 140 is a buffer 136 for buffering the matchline 140 voltage and for outputting a match signal. Typically, a logic high (e.g., VDD) match signal indicates that an exact match was detected between the input comparand bits and the stored bits. A logic low (e.g., Ground) match signal represents that at least one bit of the stored data did not match its corresponding input bit.

FIG. 2 shows a portion of the FIG. 1 circuit in greater detail. The CAM cell 191 of FIG. 2 is representational of any of the CAM cells 191 of FIG. 1. The CAM cell 191 includes a storage element 104 and transistors 110, 112, 106, 108, 162, 164. The storage element 104 is used to store a data bit and the complement of the data bit. The output $Q_0$ of storage element 104, which is to be compared with the complement input bit $B_0^*$, is coupled to the gate of transistor 106. The first source/drain terminal of transistor 106 is coupled to the matchline 140 (FIG. 1) through line 120. The second source/drain terminal of transistor 106 is coupled to transistor 110. The second source/drain terminal of transistor 110 is coupled to discharge line 142 (FIG. 1) through line 128. The gate of transistor 110 is coupled to complement input bit $B_0^*$.

Input bit $B_0$, used to store information in the storage element, is also coupled to the first source/drain terminal of transistor 162 through line 150. The second source/drain terminal of transistor 162 is coupled to an input of storage element 104. The gate of transistor 162 is coupled to wordline 144.

Further, the complement output $Q_0^*$ of storage element 104, which is to be compared with the input bit $B_0$, is coupled to the gate of transistor 108. First source/drain terminal of transistor 108 is coupled to the matchline 140 (FIG. 1) through line 122. The second source/drain terminal of transistor 108 is coupled to transistor 112. The second source/drain terminal of transistor 112 is coupled to discharge line 142 (FIG. 1) through line 130. The gate of transistor 112 is coupled to the input bit $B_0$.

Complement input bit $B_0^*$ is also coupled to the first source/drain terminal of transistors 164 through line 152. The second source/drain terminal of transistor 164 is coupled to an input of storage element 104. The gate of transistor 164 is coupled to a wordline 144.

To write to or to read from the storage element 104, the wordline 144 is set to a logic high then to a logic low, which temporarily activates transistors 162, 164 and couples the storage element 104, to input bit $B_0$ and the complement input bit $B_0^*$.

Referring to FIGS. 1 and 2, during operation of the match detection circuit 100, the precharge signal goes logic low then logic high in order to precharge the matchline 140 to VDD. The states of a bit stored by storage element 104 and the complement of the stored bit are respectively coupled to the gates of transistors 106, 108 via outputs $Q_0$, $Q_0^*$.

Consequently, depending upon the states at their respective gates, the transistors 106, 108 may become active.

Similarly, the states of the input bit $B_0$ and its complement $B_0^*$ are coupled to the gates of transistors 112, 110. Consequently, depending upon the states at their respective gates, the transistors 112, 110 may be active. Consequently, input bit $B_0$ and its complement $B_0^*$ serve two functions: they function to read and write information to the storage element 104 and they also function to carry the information stored in the comparand for comparison with information stored in the storage element 104.

As seen in FIG. 2, when a match is detected, at least one transistor of each serially connected pair of transistors (e.g., 106 and 110, 108 and 112) is inactive and not conducting. Therefore, when the matchline 140 remains logic high, this signifies to the outside world that a match has been detected and potentially enables any other functions desired when a match is detected (e.g., provide the user with the address of the memory location where the match was found, forward the data to another location, etc.).

However, when a mismatch is detected, as is most often the case during a search for a particular bit pattern, at least one pair of serially connected transistors (e.g., 106 and 108, 110 and 112) is active and conducting and the matchline 140 is coupled to the ground potential. When the matchline 140 is coupled to the ground potential, the match signal goes logic low, which signifies to the outside world that a mismatch has been detected for this storage element 104. Although match circuit 100 of FIG. 1 is shown with two CAM cells 191, any number of CAM cells may be utilized.

In the above-identified search process, the searched data (i.e., the input bits from the comparand) is simultaneously compared with every data word in the match detection circuit 100 in order to find a match between the stored data and the input data.

Conventional testing of the match detection circuit 100 begins by precharging the matchline 140 to a predetermined voltage, e.g., VDD, so that the matchline 140 floats (assuming no significant leakage otherwise exists in the circuit). Stored data in the match detection circuit 100 is then compared to comparand data. Using predetermined comparand and stored data, the expected results (e.g., match or mismatch) are easily determined. The actual results of the test are compared with the expected results to determine the reliability of the match detection circuit 100.

Because of the architecture of the match detection circuit 100, it is possible that, due to defects during design or manufacturing, the circuits within the match detection circuit 100 will cause an erroneous match or mismatch signal to be generated. Further, elements of an array containing match detection circuits 100 may pass conventional tests, but they may be "weak" or marginally acceptable.

Therefore, it is desirable to test the margin of the match detection circuit 100 to determine its reliability.

BRIEF SUMMARY OF THE INVENTION

The present invention provides a test circuit for determining a margin of a match detection circuit.

In accordance with an exemplary embodiment of the invention, a test circuit is coupled to a matchline of a match detection circuit. The test circuit applies a load to the matchline to determine whether the matchline will be pulled to a level indicating a mismatch when there is a mismatch in the match detection circuit. The test circuit may include several different loads that can be applied to the matchline.

In accordance with another exemplary embodiment of the invention, a test circuit is coupled to a matchline of a match detection circuit. The test circuit applies a load to the matchline to determine whether the matchline can hold a precharge value, e.g., to test whether, and to what extent, the matchline will resist being pulled to ground when there is a match in the match detection circuit. The test circuit may also include several different loads that can be applied to the matchline.

In accordance with yet another exemplary embodiment of the invention, a test circuit is coupled to a discharge line of a match detection circuit. The test circuit applies a load to the discharge line to determine whether the matchline will be pulled to ground when the matchline is coupled to the discharge line. The test circuit may include several different loads that can be applied to the discharge line.

BRIEF DESCRIPTION OF THE DRAWINGS

These and other features and advantages of the invention will be more readily understood from the following detailed description of the invention that is provided in connection with the accompanying drawings, in which.

DETAILED DESCRIPTION OF THE INVENTION

In the following detailed description, reference is made to the accompanying drawings, which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 3:
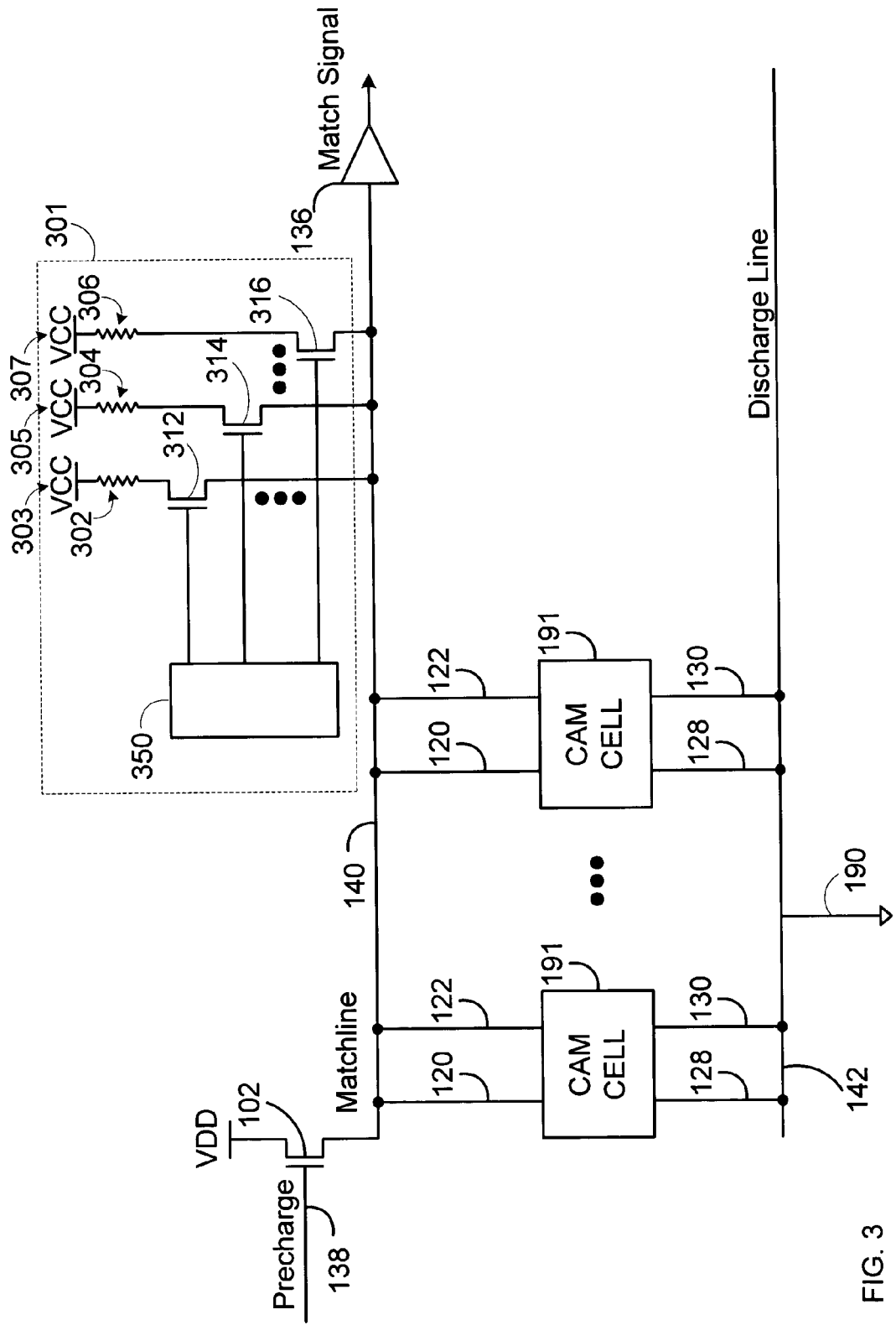
FIG. 3 is a schematic diagram of a match detection circuit in accordance with an exemplary embodiment of the invention.

FIG. 3 depicts a schematic diagram of a CAM match detection circuit 300, in accordance with an exemplary embodiment of the invention. The configuration of the FIG.

Figure 1:
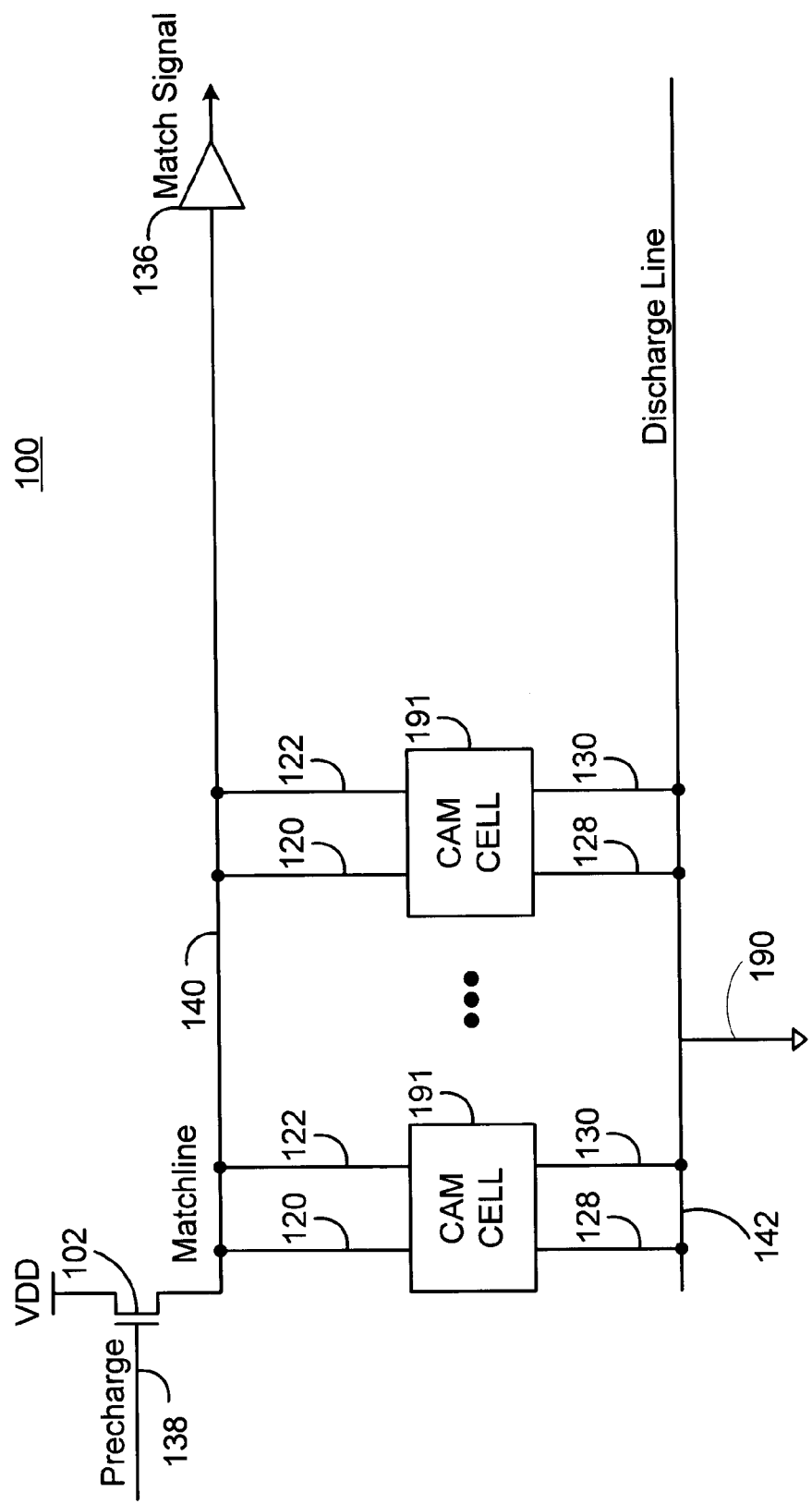
FIG. 1 is a schematic diagram of a conventional match detection circuit.
Figure 2:
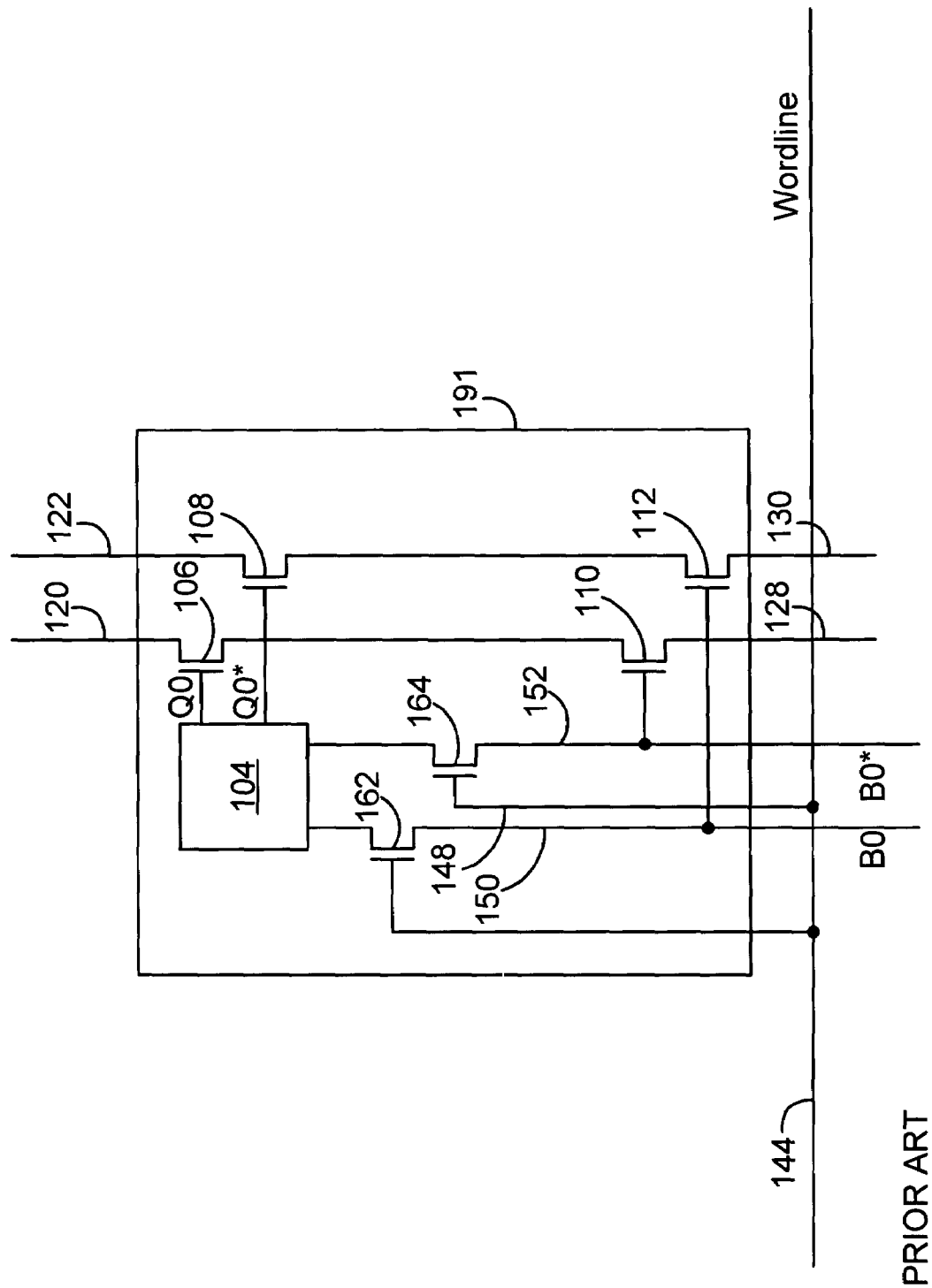
FIG. 2 is a schematic diagram of the circuit of FIG. 1 in greater detail.

3 match detection circuit 300 differs from that of the FIG. 1 match detection circuit 100 in that match detection circuit 300 includes test circuit 301.

Test circuit 301 stresses the matchline 140 to determine whether matchline 140 will be pulled to ground under various loads. During the operation of a match detection circuit, a matchline is pulled to ground if a mismatch occurs (e.g., the comparand data does not match the stored data in the match detection circuit). During a search operation, test circuit 301 applies a load to the matchline 140 to determine if it will be pulled to ground when a mismatch occurs while the load is being provided.

Test circuit 301 includes control circuit 350 and at least one test line providing a connection between the matchline 140 and a voltage VCC, where VCC is a voltage different, preferably higher, than VDD. As seen in FIG. 3, test circuit 301 has three test lines 303, 305, and 307. Test line 303 switchably couples VCC to matchline 140 through switch 312 and resister 302. The gate of transistor 312 is coupled to control circuit 350. Test line 305 switchably couples VCC to matchline 140 through switch 314 and resister 304. The gate of transistor 314 is coupled to control circuit 350. Test line 307 switchably couples VCC to matchline 140 through switch 316 and resister 306. The gate of transistor 316 is coupled to control circuit 350. Although test circuit 301 is shown with three test lines 303, 305, 307, any number of test lines may be used. Each resister 302, 304, 306 has a different resistance, so that each test line 303, 305, 307 provides a different load to matchline 140. The illustrated switches 312, 314, 316 are transistors, but could be any controllable switch.

During the testing operation, the matchline 140 is precharged by temporarily coupling the matchline 140 to VDD. The matchline 140 is left floating. Control circuit 350 sends a signal to a test line, e.g., one of test lines 303, 305, 307, thereby activating the respective transistor 312, 314, 316 (i.e., closing the switch), and coupling the matchline 140 to VCC through the respective resistor 302, 304, 306. The load provided by the test line 303, 305, 307 relates to the resistance of its respective resistor 302, 304, 306. The stored data in the CAM cells 191 are compared with comparand data. If a mismatch occurs between the stored data and the comparand data, then the matchline 140 is coupled to ground through the CAM cell 191 (having the mismatch) and the discharge line 142. The connection between the matchline 140 and the discharge line 142 is also referred to herein as a mismatch circuit. The resulting charge on matchline 140, after a mismatch, relates to the strength of the mismatch circuit versus the load on the line provided by the test circuit 301. Thus, the test circuit 301 is used to see if the mismatch circuit can still discharge the matchline 140 to ground during mismatches.

Testing parameters may be predetermined. For example, it may be known that the match detection circuit 300 will be implemented in an environment with a known load being provided to the matchline 140. It is desirable to determine if the match detection circuit 300 performs under that known load. In these cases, the test circuit 301 is programmed to provide that known load to the matchline 140.

Further, testing may be done iteratively, each time applying a different load to the match detection circuit 300. Determining the margin of the match detection circuit 300 permits the manufacturer, or tester, to appropriately bin and price the match detection circuit 300, or the device containing the match detection circuit 300, according to its margin.

Figure 4:
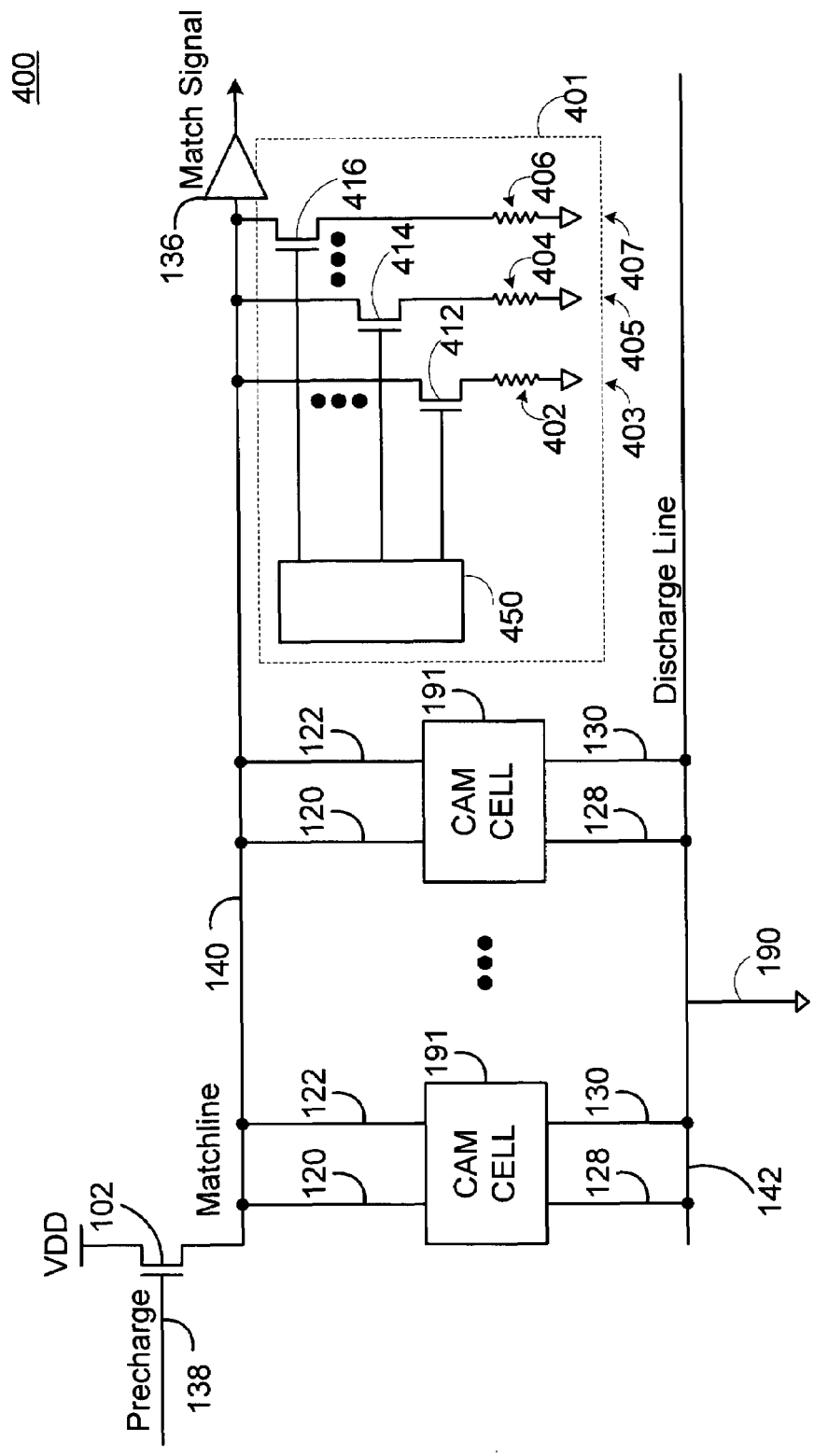
FIG. 4 is a schematic diagram of a match detection circuit in accordance with an another exemplary embodiment of the invention.

FIG. 4 depicts a schematic diagram of a CAM match detection circuit 400, in accordance with another exemplary embodiment of the invention. The configuration of the FIG. 4 match detection circuit 400 differs from that of the FIG. 3 match detection circuit 300 in that match detection circuit 400 includes test circuit 401, instead of circuit 301.

Test circuit 401 stresses the matchline 140 to determine whether matchline 140 can be precharged and whether it will hold the charge under various loads. This test is important because during the operation of a match detection circuit, the matchline is not supposed to be pulled to ground if a match occurs. During the precharge operation, test circuit 401 applies a load to the matchline 140 to determine if the matchline 140 will hold the precharge value or if it will be pulled towards ground.

Test circuit 401 includes control circuit 450 and at least one test line providing a connection between the matchline 140 and ground. As seen in FIG. 4, test circuit 401 has three test lines 403, 405, and 407. Test line 403 switchably couples matchline 140 to ground through switch 412 and resister 402. The gate of transistor 412 is coupled to control circuit 450. Test line 405 switchably couples matchline 140 to ground through switch 414 and resister 404. The gate of transistor 414 is coupled to control circuit 450. Test line 407 switchably couples matchline 140 to ground through switch 416 and resister 406. The gate of transistor 416 is coupled to control circuit 450. Although test circuit 401 is shown with three test lines 403, 405, 407, any number of test lines may be used. Each resister 402, 404, 406 has a different resistance, so that each test line 403, 405, 407 provides a different load to matchline 140. The illustrated switches 412, 414, 416 are transistors, but could be any controllable switch.

During the testing operation, the matchline 140 is precharged by temporarily coupling the matchline 140 to VDD. Control circuit 450 sends a signal to a test line, e.g., one of test lines 403, 405, 407, thereby activating the respective transistor 412, 414, 416, and coupling the matchline 140 to ground through a respective resistor 402, 404, 406. The load provided by the test line 403, 405, 407 relates to the resistance of the respective resistor 402, 404, 406. The stored data in the CAM cells 191 are compared with comparand data. The resulting charge on matchline 140 after a match occurs relates to the strength of the matchline 140 versus the load on the line provided by the test circuit 401. If a match occurs between the stored data and the comparand data, then the voltage of the matchline 140 should be substantially equivalent to the precharged voltage. Thus, the test circuit 401 is used to see if the matchline 140 can hold the precharge voltage.

Figure 5:
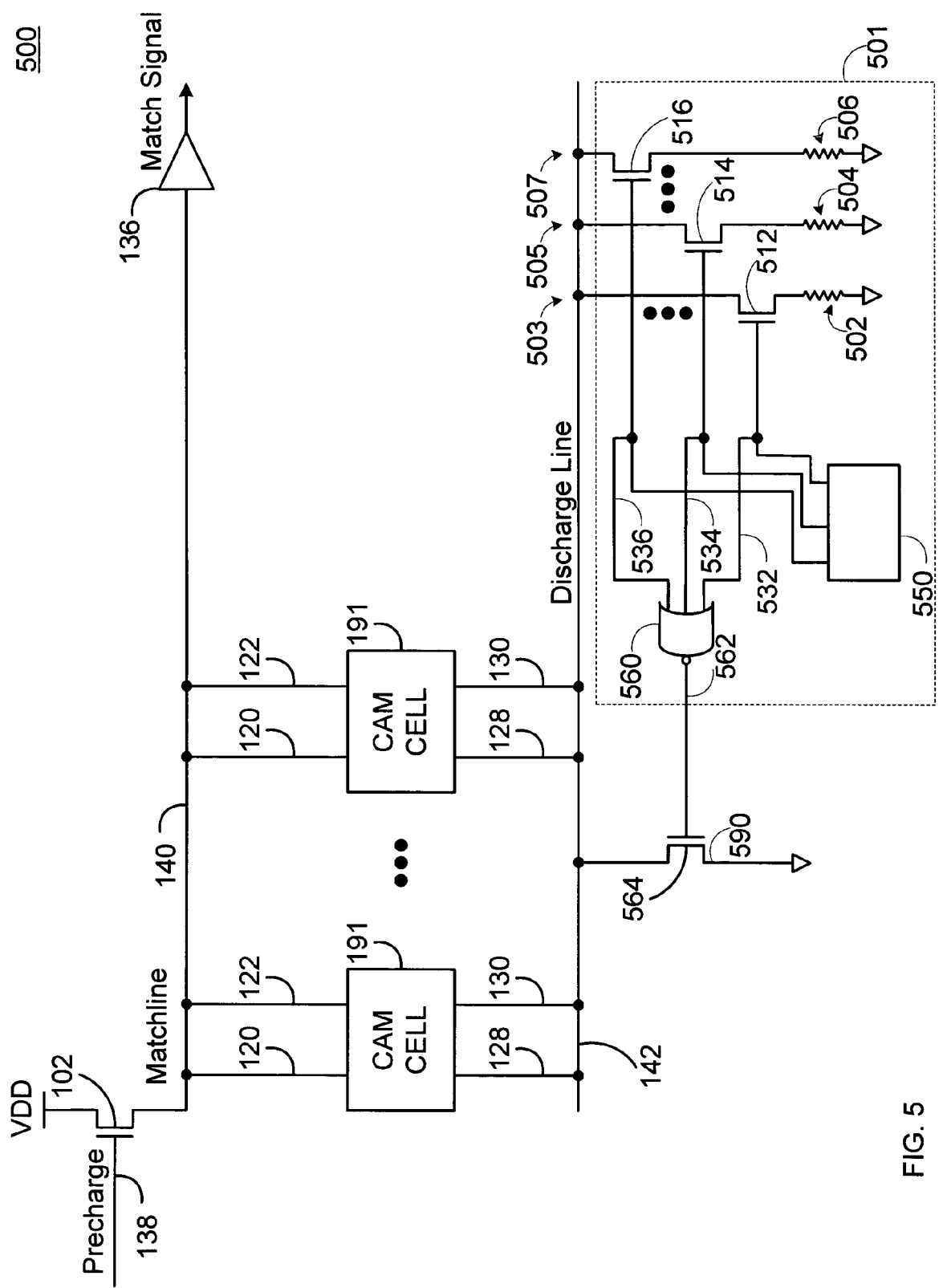
FIG. 5 is a schematic diagram of a match detection circuit in accordance with an yet another exemplary embodiment of the invention.

FIG. 5 depicts a schematic diagram of a CAM match detection circuit 500, in accordance with another exemplary embodiment of the invention. The configuration of the FIG. 5 match detection circuit 500 differs from the FIG. 3 match detection circuit 300 and FIG. 4 match detection circuit 400 in that match detection circuit 500 includes test circuit 501 instead of test circuit 301 or test circuit 401.

Test circuit 501 stresses the matchline 140 to determine if matchline 140 will be pulled to ground under various loads—i.e., circuit 501 tests the ability of the circuit to discharge the matchline 140. This test is needed because during the operation of a match detection circuit, the matchline 140 is pulled to ground if a mismatch occurs. During a search operation, test circuit 501 applies a load to the discharge line 142 to determine if the match detection circuit 500 will be discharged when a mismatch occurs while the load is coupled to the discharge line 142.

Test circuit 501 includes control circuit 550 and at least one test line providing a connection between the discharge line 142 and ground. As seen in FIG. 5, test circuit 501 has three test lines 503, 505, and 507. Test line 503 switchably couples discharge line 142 to ground through switch 512 and resister 502. The gate of transistor 512 is coupled to control circuit 550. Test line 505 switchably couples discharge line 142 to ground through switch 514 and resister 504. The gate of transistor 514 is coupled to control circuit 550. Test line 507 switchably couples discharge line 142 to ground through switch 516 and resister 506. The gate of transistor 516 is coupled to control circuit 550. Although test circuit 501 is shown with three test lines 503, 505, 507, any number of test lines may be used. Each resister 502, 504, 506 has a different resistance, so that each test line 503, 505, 507 provides a different load to discharge line 142. The illustrated switches 512, 514, 516 are transistors, but could be any controllable switch.

Discharge line 142 is also switchably coupled to ground through transistor 564. The gate of transistor 564 is coupled to the output of NAND circuit 560. The input of NAND circuit 560 is coupled to lines 532, 534, 536. When in operation control circuit 550 provides a signal on any one of lines 532, 534, 536 (thereby enabling a respective test line 503, 505, 507 to activate its respective transistor 512, 514, 516), no signal is provided to transistor 564 and thus, transistor 564 is inactive. When in operation, control circuit 550 does not provide a signal on any one of lines 532, 534, 536, a signal is provided to transistor 564, thereby activating transistor 564 and coupling the discharge line 142 directly to ground.

During the testing operation, the matchline 140 is precharged by temporarily coupling the matchline 140 to VDD, to cause the matchline 140 to float. Control circuit 550 sends a signal to a test line, e.g., one of test lines 503, 505, 507, thereby activating the respective transistor 512, 514, 516 (i.e., closing the switch), and coupling the discharge line 142 to ground through a respective resistor 502, 504, 506. The load provided by the test line 503, 505, 507 relates to the resistance of the respective resistor 502, 504, 506. The stored data in the CAM cells 191 are compared with comparand data. If a mismatch occurs between the stored data and the comparand data, the matchline 140 is coupled to the discharge line 142 through the CAM cell 191. The resulting charge on matchline 140 after a mismatch occurs relates to the strength of the charge on the matchline 140 versus the load on the discharge line 142 provided by the test circuit 501. So the test circuit 501 is used to see if the match detection circuit 500 will properly discharge the matchline 142 in the case of a mismatch.

Figure 6:
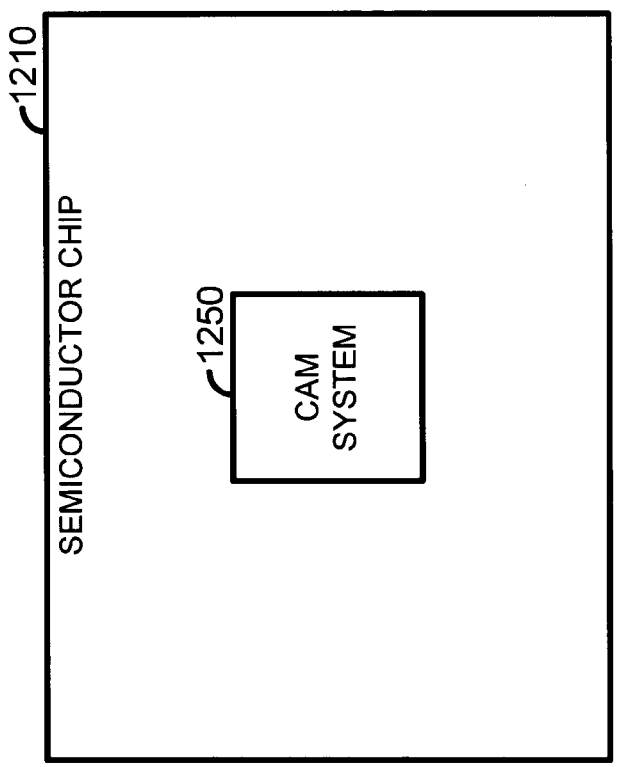
FIG. 6 is a schematic diagram of a semiconductor chip employing either the match detection circuit of FIGS. 3, 4, or 5, in accordance with another exemplary embodiment of the invention.

FIG. 6 depicts a CAM system 1250 provided on a semiconductor memory chip 1210. The CAM system 1250 includes a match detection circuit such as those described in connection with FIGS. 3–5. Chip 1210 may be incorporated into a router or other processor system as described below.

Figure 7:
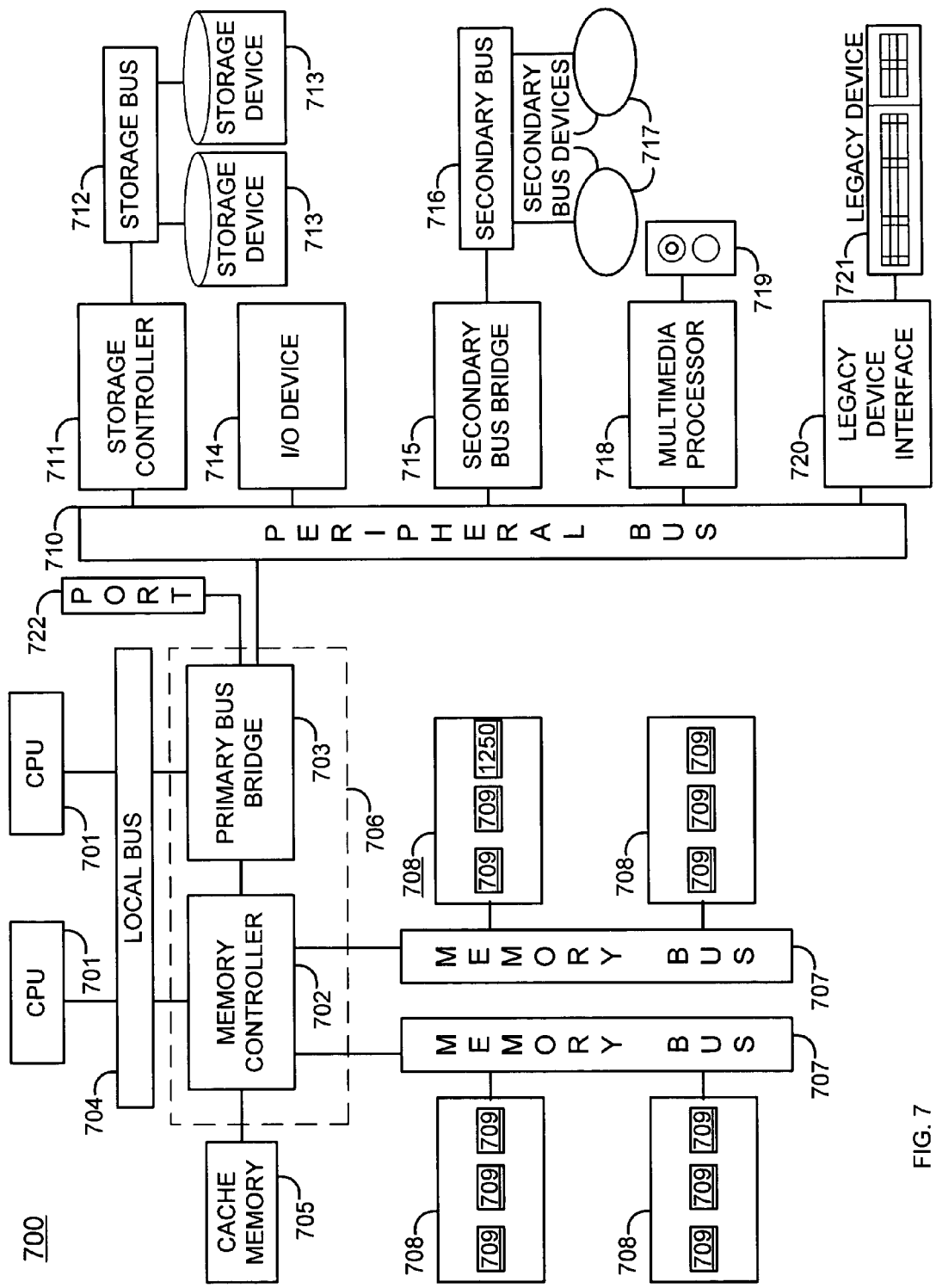
FIG. 7 is a schematic diagram of a processor system employing either the match detection circuit of FIGS. 3, 4, or 5, in accordance with another exemplary embodiment of the invention.

FIG. 7 illustrates an exemplary processing system 700 that employs the CAM system 1250 of FIG. 6. The processing system 700 includes one or more processors 701 coupled to a local bus 704. A memory controller 702 and a primary bus bridge 703 are also coupled the local bus 704. The processing system 700 may include multiple memory controllers 702 and/or multiple primary bus bridges 703. The memory controller 702 and the primary bus bridge 703 may be integrated as a single device 706.

The memory controller 702 is also coupled to one or more memory buses 707. Each memory bus accepts memory components 708. Any one of memory components 708 may contain a CAM system 1250 such as that described in connection with FIG. 6.

The memory components 708 may be a memory card or a memory module. The memory components 708 may include one or more additional devices 709. For example, in a SIMM or DIMM, the additional device 709 might be a configuration memory, such as a serial presence detect (SPD) memory. The memory controller 702 may also be coupled to a cache memory 705. The cache memory 705 may be the only cache memory in the processing system. Alternatively, other devices, for example, processors 701 may also include cache memories, which may form a cache hierarchy with cache memory 705. If the processing system 700 includes peripherals or controllers, which are bus masters or which support direct memory access (DMA), the memory controller 702 may implement a cache coherency protocol. If the memory controller 702 is coupled to a plurality of memory buses 707, each memory bus 707 may be operated in parallel, or different address ranges may be mapped to different memory buses 707.

The primary bus bridge 703 is coupled to at least one peripheral bus 710. Various devices, such as peripherals or additional bus bridges may be coupled to the peripheral bus 710. These devices may include a storage controller 711, a miscellaneous I/O device 714, a secondary bus bridge 715, a multimedia processor 718, and a legacy device interface 720. The primary bus bridge 703 may also be coupled to one or more special purpose high speed ports 722. In a personal computer, for example, the special purpose port might be the Accelerated Graphics Port (AGP), used to couple a high performance video card to the processing system 700.

The storage controller 711 couples one or more storage devices 713, via a storage bus 712, to the peripheral bus 710. For example, the storage controller 711 may be a SCSI controller and storage devices 713 may be SCSI discs. The I/O device 714 may be any sort of peripheral. For example, the I/O device 714 may be a local area network interface, such as an Ethernet card. The secondary bus bridge may be used to interface additional devices via another bus to the processing system. For example, the secondary bus bridge may be a universal serial port (USB) controller used to couple USB devices 717 via to the processing system 700. The multimedia processor 718 may be a sound card, a video capture card, or any other type of media interface, which may also be coupled to additional devices such as speakers 719. The legacy device interface 720 is used to couple legacy devices, for example, older styled keyboards and mice, to the processing system 700.

The processing system 700 illustrated in FIG. 7 is only an exemplary processing system with which the invention may be used. While FIG. 7 illustrates a processing architecture especially suitable for a general purpose computer, such as a personal computer or a workstation, it should be recognized that well known modifications can be made to configure the processing system 700 to become more suitable for use in a variety of applications. For example, many electronic devices that require processing may be implemented using a simpler architecture that relies on a CPU 701 coupled to memory components 708 and/or memory devices 709. The modifications may include, for example, elimination of unnecessary components, addition of specialized devices or circuits, and/or integration of a plurality of devices.

Figure 8:
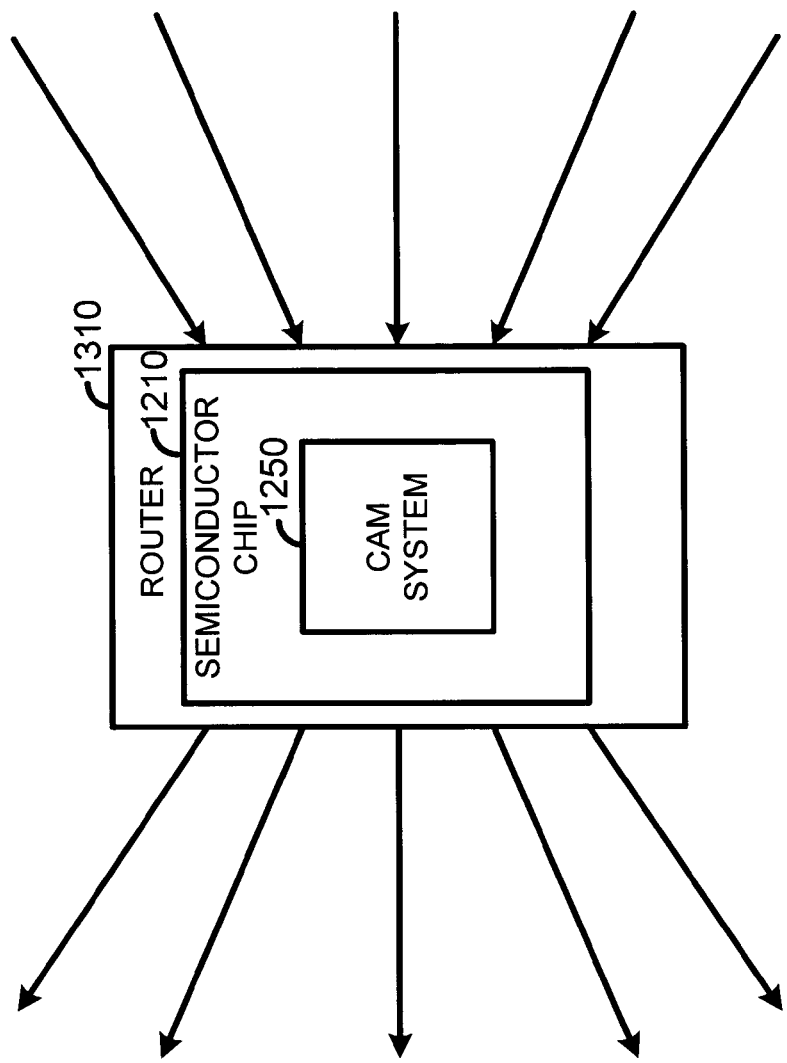
FIG. 8 is a schematic diagram of a router system employing either the match detection circuit of FIGS. 3, 4, or 5, in accordance with another exemplary embodiment of the invention.

FIG. 8 is a block diagram of a router 1310 as may be used in a communications network, such as, e.g., part of the Internet backbone. The router 1310 contains a plurality of input lines and a plurality of output lines. When data is transmitted from one location to another, it is sent in a form known as a packet. Oftentimes, prior to the packet reaching its final destination, that packet is first received by a router, or some other device. The router 1310 then decodes that part of the data identifying the ultimate destination and decides which output line and what forwarding instructions are required for the packet.

Generally, CAMs are very useful in router applications because historical routing information for packets received from a particular source and going to a particular destination is stored in the CAM of the router. As a result, when a packet is received by the router 1310, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Still referring to FIG. 8, router 1310 contains the added benefit of employing a semiconductor memory chip 1210 containing a CAM system 1250, such as that depicted in FIG. 6. Therefore, not only does the router benefit from having a CAM but also benefits by having a CAM system, in accordance with an exemplary embodiment of the invention.

Other embodiments of the invention include different combinations of the above described exemplary embodiments. For example, another embodiment includes two of the above test circuits coupled to, or adapted to be coupled to, a match detection circuit, e.g., test circuit 301 and 401, test circuit 401 and 501, and test circuit 301 and 501. In yet another embodiment of the invention includes all three test circuits 301, 401, 501.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A test circuit for testing a match detection circuit, said test circuit comprising:
   a test line for providing a load to the match detection circuit; and
   a switch for switchably coupling the test line to a first line of the match detection circuit to provide the load on the first line for testing whether the match detection circuit is correctly indicating either a match or mismatch.

2. The test circuit of claim 1, wherein said first line of said match detection circuit comprises:
   a matchline.

3. The test circuit of claim 1, wherein said first line of said match detection circuit comprises:
   a discharge line.

4. The test circuit of claim 1, further comprising:
   a test circuit controller for controlling said switch.

5. The test circuit of claim 1, wherein said load is a resistor.

6. The test circuit of claim 1, further comprising:
   a second test line for providing a second load to the match detection circuit; and
   a second switch for switchably coupling the second test line to the first line of the match detection circuit to provide the second load on the first line for testing whether the match detection circuit is correctly indicating either a match or mismatch.

7. The test circuit of claim 6, wherein said second load is different from said first load.

8. The test circuit of claim 6, further comprising:
   a third test line for providing a third load to the match detection circuit; and
   a third switch for switchably coupling the third test line to the first line of the match detection circuit to provide the third load on the first line for testing whether the match detection circuit is correctly indicating either a match or mismatch.

9. The test circuit of claim 8, wherein said third load is different from said first load.

10. The test circuit of claim 9, wherein said third load is different from said second load.

11. A test circuit for a detection match circuit, said test circuit comprising:
    a test line being switchably coupled to a first line of a match detection circuit for providing a load to said match detection circuit to test match detection's circuit ability to either hold a value or discharge a value.

12. The test circuit of claim 11, wherein said test line comprises:
    a load; and
    a test line transistor coupled between said load and said match detection circuit.

13. The test circuit of claim 12, wherein said load further comprises a voltage, wherein said voltage is coupled to said test line transistor through said resistor.

14. The test circuit of claim 12, wherein said load further comprises a ground potential, wherein said ground potential is coupled to said test line transistor through said resistor.

15. The test circuit of claim 11, wherein said first line of said match detection circuit is a matchline.

16. The test circuit of claim 11, wherein said first line of said match detection circuit is a discharge line.

17. The test circuit of claim 11 further comprising:
    a test circuit controller coupled to the gate of said test line transistor through a test control line for activating said test line transistor.

18. The test circuit of claim 17 further comprising:
    a decision circuit for receiving input from said test control line for determining if said test control line has been enabled and outputting a circuit enable signal reflecting the results of said determination, said enable signal adapted to be received by a gate of transistor in between said discharge line and ground, said decision circuit coupled to said test control line.

19. The test circuit of claim 18, where said decision circuit comprises a NOR circuit.

20. A test circuit for a match detection circuit, said test circuit comprising:
    a test circuit for providing a first load to said match detection circuit to test a margin of said match detection circuit.

21. The test circuit of claim 20, wherein said test circuit further comprises:
    a first test line for providing said first load to said match detection circuit.

22. The test circuit of claim 21, wherein said test circuit further comprises:
    a second test line for providing a second load to said match detection circuit.

23. The test circuit of claim 22, wherein said second load has a different load value than a load value of said first load.

24. The test circuit of claim 22, wherein said test circuit further comprises:
a test line transistor for switchably coupling said test line to said match detection circuit, wherein one of said source/drain regions of said test line transistor is coupled to said match detection circuit, the other of said source/drain regions of said test line transistor is coupled to a load.

25. The test circuit of claim 24, wherein said test circuit further comprises:
a test circuit controller for controlling said first load provided to said match detection circuit, said test circuit controller coupled to said gate of said test line transistor.

26. The test circuit of claim 20, wherein said test circuit is switchably coupled to a matchline of said match detection circuit.

27. The test circuit of claim 20, wherein said test circuit is switchably coupled to a discharge line of said match detection circuit.

28. A test circuit for testing a match detection circuit, said test circuit comprising:
a test circuit controller;
a plurality of test lines switchably coupled to a matchline of said match detection circuit to test a feature of said match detection circuit, wherein each of said plurality of test lines comprises:
a load, wherein said load is a resistor; and
a test line transistor for switchably coupling said load and said matchline for testing whether the match detection circuit is correctly indicating either a match or mismatch, a gate of said test line transistor coupled to said test circuit controller.

29. A test circuit for testing a match detection circuit, said test circuit comprising:
a test circuit controller;
a plurality of test lines switchably coupled to a matchline of said match detection circuit to test a feature of said match detection circuit, wherein each of said plurality of test lines comprises:
a load, wherein said load is a voltage; and
a test line transistor for switchably coupling said load and said matchline for testing whether the match detection circuit is correctly indicating either a match or mismatch, a gate of said test line transistor coupled to said test circuit controller.

30. A test circuit for testing a match detection circuit, said test circuit comprising:
a test circuit controller;
a decision circuit;
a plurality of test lines switchably coupled to a discharge line of said match detection circuit to test a feature of said match detection circuit, wherein each of said plurality of test lines comprises:
a load, wherein said load is a resistor; and
a test line transistor for switchably coupling said load and said discharge line for testing whether the match detection circuit is correctly indicating either a match or mismatch, a gate of said test line transistor coupled to said test circuit controller.

31. A router, comprising:
a content addressable memory (CAM) system, said CAM system comprising:
a test circuit for testing a match detection circuit, said test circuit comprising:
a test circuit controller;
a plurality of test lines switchably coupled to a matchline of said match detection circuit to test a feature of said match detection circuit, wherein each of said plurality of test lines comprises:
a load, wherein said load is a resistor; and
a test line transistor for switchably coupling said load and said matchline for testing whether the match detection circuit is correctly indicating either a match or mismatch, a gate of said test line transistor coupled to said test circuit controller.

32. A router, comprising: a content addressable memory (CAM) system, said CAM system comprising:
a test circuit for testing a match detection circuit, said test circuit comprising:
a test circuit controller;
a plurality of test lines switchably coupled to a matchline of said match detection circuit to test a feature of said match detection circuit, wherein each of said plurality of test lines comprises:
a load, wherein said load is a voltage; and
a test line transistor for switchably coupling said load and said matchline for testing whether the match detection circuit is correctly indicating either a match or mismatch, a gate of said test line transistor coupled to said test circuit controller.

33. A router, comprising:
a content addressable memory (CAM) system, said CAM system comprising:
a test circuit for testing a match detection circuit, said test circuit comprising:
a test circuit controller;
a decision circuit;
a plurality of test lines switchably coupled to a discharge line of said match detection circuit to test a feature of said match detection circuit, wherein each of said plurality of test lines comprises:
a load, wherein said load is a resistor; and
a test line transistor for switchably coupling said load and said discharge line for testing whether the match detection circuit is correctly indicating either a match or mismatch, a gate of said test line transistor coupled to said test circuit controller.

34. A integrated circuit chip, comprising:
a content addressable memory (CAM) system, said CAM system comprising:
a test circuit for testing a match detection circuit, said test circuit comprising:
a test circuit controller;
a plurality of test lines switchably coupled to a matchline of said match detection circuit to test a feature of said match detection circuit, wherein each of said plurality of test lines comprises:
a load, wherein said load is a resistor; and
a test line transistor for switchably coupling said load and said matchline for testing whether the match detection circuit is correctly indicating either a match or mismatch, a gate of said test line transistor coupled to said test circuit controller.

35. A integrated circuit chip, comprising:
a content addressable memory (CAM) system, said CAM system comprising:
a test circuit for testing a match detection circuit, said test circuit comprising: a test circuit controller;
a plurality of test lines switchably coupled to a matchline of said match detection circuit to test a feature of said match detection circuit, wherein each of said plurality of test lines comprises:

a load, wherein said load is a voltage; and
a test line transistor for switchably coupling said load and said matchline for testing whether the match detection circuit is correctly indicating either a match or mismatch, a gate of said test line transistor coupled to said test circuit controller.

36. A integrated circuit chip, comprising:
a content addressable memory (CAM) system, said CAM system comprising:
  a test circuit for testing a match detection circuit, said test circuit comprising:
  a test circuit controller;
  a decision circuit;
  a plurality of test lines switchably coupled to a discharge line of said match detection circuit to test a feature of said match detection circuit, wherein each of said plurality of test lines comprises:
    a load, wherein said load is a resistor; and
    a test line transistor for switchably coupling said load and said discharge line for testing whether the match detection circuit is correctly indicating either a match or mismatch, a gate of said test line transistor coupled to said test circuit controller.

37. A processor system, comprising:
a processor;
a content addressable memory (CAM) system, said CAM system comprising:
  a test circuit for testing a match detection circuit, said test circuit comprising:
  a test circuit controller;
  a plurality of test lines switchably coupled to a matchline of said match detection circuit to test a feature of said match detection circuit, wherein each of said plurality of test lines comprises:
    a load, wherein said load is a resistor; and
    a test line transistor for switchably coupling said load and said matchline for testing whether the match detection circuit is correctly indicating either a match or mismatch, a gate of said test line transistor coupled to said test circuit controller.

38. A processor system, comprising:
a processor; a content addressable memory (CAM) system, said CAM system comprising:
a test circuit for testing a match detection circuit, said test circuit comprising:
  a test circuit controller;
  a plurality of test lines switchably coupled to a matchline of said match detection circuit to test a feature of said match detection circuit, wherein each of said plurality of test lines comprises:
    a load, wherein said load is a voltage; and
    a test line transistor for switchably coupling said load and said matchline for testing whether the match detection circuit is correctly indicating either a match or mismatch, a gate of said test line transistor coupled to said test circuit controller.

39. A processor system, comprising:
a processor;
a content addressable memory (CAM) system, said CAM system comprising:
  a test circuit for testing a match detection circuit, said test circuit comprising:
  a test circuit controller;
  a decision circuit;
  a plurality of test lines switchably coupled to a discharge line of said match detection circuit to test a feature of said match detection circuit, wherein each of said plurality of test lines comprises:
    a load, wherein said load is a resistor; and
    a test line transistor for switchably coupling said load and said discharge line for testing whether the match detection circuit is correctly indicating either a match or mismatch, a gate of said test line transistor coupled to said test circuit controller.

40. A method of testing a match detection circuit, comprising the steps of:
switchably coupling a load to said match detection circuit; and
applying said load to said match detection circuit for testing whether the match detection circuit is correctly indicating either a match or mismatch.

41. The method of claim 40, further comprising:
comparing a stored data bit in said match detection circuit with a comparand data bit.

42. The method of claim 40, wherein said step of switching further comprises:
applying resistance to a first line of said match detection circuit.

43. The method of claim 40, wherein said step of switching further comprises:
applying voltage to a first line of said match detection circuit.

44. The method of claim 42, wherein said first line is a matchline.

45. The method of claim 43, wherein said first line is a matchline.

46. The method of claim 43, wherein said first line is a discharge line.

47. A method of testing a match detection circuit, comprising the step of:
precharging a matchline of said match detection circuit;
applying a load to said matchline to test a feature of the match detection circuit;
comparing a stored bit in said match detection circuit with a comparand bit; and
determining whether said matchline is pulled to ground when a mismatch occurs in said comparing step.

48. The method of claim 47, wherein said applying step comprises:
applying a voltage to said matchline of said match detection circuit.

49. The method of claim 47, further comprising the step of:
applying a second load to said matchline of said match detection circuit.

50. The method of claim 49, further comprising the step of:
applying a third load to said matchline of said match detection circuit.

51. A method of testing a match detection circuit, comprising the step of:
precharging a matchline of said match detection circuit;
applying a load to said matchline to test a feature of the match detection circuit;
comparing a stored bit in said match detection circuit with a comparand bit; and
determining whether said matchline is pulled to ground when a match occurs in said comparing step.

52. The method of claim 51, wherein said applying step comprises applying a ground potential to said matchline of said match detection circuit.

53. The method of claim 52, further comprising the step of:

applying a second load to said matchline of said match detection circuit.

54. The method of claim 53, further comprising the step of:

applying a third load to said matchline of said match detection circuit.

55. A method of testing a match detection circuit, comprising the steps of:

precharging a matchline of said match detection circuit;

applying a load to a discharge line to test a feature of the match detection circuit;

comparing a stored bit in said match detection circuit with a comparand bit; and determining whether said matchline is pulled to ground when a mismatch occurs in said comparing step.

56. The method of claim 55, wherein said applying step comprises:

applying a ground potential to said discharge line of said match detection circuit.

57. The method of claim 55, further comprising the step of:

applying a second load to said discharge line of said match detection circuit.

58. The method of claim 57, further comprising the step of:

applying a third load to said discharge line of said match detection circuit.

59. A content addressable memory, comprising:

a match detection circuit coupled to a match line and a discharge line; and a test circuit for testing said match detection circuit, said test circuit comprising:

at least one test line for testing a feature of said match detection circuit, wherein said test line comprises:

a resistance; and a test line transistor for selectively coupling said resistance between said matchline and a voltage source line for testing whether the match detection circuit is correctly indicating either a match or mismatch.

60. The content addressable memory of claim 59, further comprising:

a plurality of test lines having respective resistances.

61. The content addressable memory of claim 59, further comprising:

a plurality of test lines having respective resistances.

62. The content addressable memory of claim 59, further comprising:

a plurality of test lines having respective resistances.

63. A content addressable memory, comprising:

a match detection circuit coupled to a match line and a discharge line; and a test circuit for testing said match detection circuit, said test circuit comprising:

at least one test line for testing a feature of said match detection circuit, wherein said test line comprises:

a resistance; and a test line transistor for selectively coupling said resistance between said match line and a ground line for testing whether the match detection circuit is correctly indicating either a match or mismatch.

64. A content addressable memory, comprising:

a match detection circuit coupled to a match line and a discharge line; and a test circuit for testing said match detection circuit, said test circuit comprising:

at least one test line for testing a feature of said match detection circuit, wherein said test line comprises:

a resistance; and a test line transistor for selectively coupling said resistance between said discharge line and a ground line for testing whether the match detection circuit is correctly indicating either a match or mismatch.

* * * * *